United States Patent [19]

Breneman et al.

[11] Patent Number: 5,412,363
[45] Date of Patent: May 2, 1995

[54] OPEN ACCESS SUPERCONDUCTING MRI MAGNET

[75] Inventors: Bruce C. Breneman; Raymond E. Sarwinski, both of San Diego; Yen-Hwa L. Hsu, Solana Beach, all of Calif.

[73] Assignee: Applied Superconetics, Inc., San Diego, Calif.

[21] Appl. No.: 259,914

[22] Filed: Jun. 10, 1994

Related U.S. Application Data

[63] Continuation-in-part of Ser. No. 811,306, Dec. 20, 1991.

[51] Int. Cl.⁶ .................. H01F 7/22; G01V 3/00
[52] U.S. Cl. .................. 335/216; 505/893; 62/51.1; 324/318; 324/319
[58] Field of Search .............. 335/216, 300; 324/318, 324/319, 320; 128/653.2; 62/51.1, 259.2, 51.2, 51.3; 505/892, 893

[56] References Cited

U.S. PATENT DOCUMENTS

| | | |
|---|---|---|
| 2,777,099 | 1/1957 | Foss . |
| 3,018,422 | 1/1962 | Seaton . |
| 3,223,897 | 12/1965 | Sullivan . |
| 3,417,356 | 12/1968 | Tschopp . |
| 3,924,211 | 12/1975 | Ioffe et al. . |
| 4,093,912 | 6/1978 | Double et al. . |
| 4,122,386 | 10/1978 | Tomita et al. . |
| 4,445,102 | 4/1984 | Thorn et al. . |
| 4,498,048 | 2/1985 | Lee et al. . |
| 4,656,449 | 4/1987 | Mallard et al. . |
| 4,672,346 | 6/1987 | Miyamoto et al. . |
| 4,675,609 | 6/1987 | Danby et al. . |
| 4,766,378 | 8/1988 | Danby et al. . |
| 4,829,252 | 5/1989 | Kaufman . |
| 4,943,774 | 7/1990 | Breneman et al. . |
| 4,980,641 | 12/1990 | Breneman et al. . |
| 5,061,897 | 10/1991 | Danby et al. . |
| 5,095,271 | 3/1992 | Ohkawa . |
| 5,124,651 | 6/1992 | Danby et al. ............... 324/318 |
| 5,138,326 | 8/1992 | Edwards et al. ............ 324/319 |
| 5,153,546 | 10/1992 | Laskaris ..................... 335/216 |
| 5,155,436 | 10/1992 | Suzuki et al. . |
| 5,184,074 | 2/1993 | Kaufman et al. . |
| 5,194,810 | 3/1993 | Breneman et al. .......... 324/319 |
| 5,207,224 | 5/1993 | Dickinson et al. . |
| 5,250,901 | 10/1993 | Kaufman et al. ............ 324/318 |

*Primary Examiner*—Leo P. Picard
*Assistant Examiner*—Raymond M. Barrera
*Attorney, Agent, or Firm*—Nydegger & Associates

[57] ABSTRACT

An open access MRI magnet includes a ferromagnetic frame open on at least two sides and having upper and lower end plates and at least two support columns. A superconducting coil assembly is mounted to each end plate for generating a magnetic flux field in a patient receiving area located between the end plates. Each superconducting coil assembly includes a toroidal vacuum tight vessel, insulation, and one or more temperature shields mounted within the vacuum tight vessel. One or more coils of superconducting wire is wound within the vacuum vessel, and is coupled to a power source and to a persistent switch for maintaining a constant flow of current with no power consumption. A return path for the flux is provided by the end plates and support posts of the frame. The superconducting coils, the thermal shields, and the persistent switch are cooled by a cryocooler, by means of conduction through solid thermal conductors or by a combination of conduction and convection, through a fluid cooling circuit, without the consumption of a liquid cryogen.

10 Claims, 4 Drawing Sheets

OPEN ACCESS SUPERCONDUCTING MRI MAGNET

TECHNICAL FIELD

This is a continuation-in-part of application Ser. No. 07/811,306, entitled OPEN ACCESS SUPERCONDUCTING MRI MAGNET, filed on Dec. 20, 1991.

BACKGROUND OF THE INVENTION

In medical diagnosis, nuclear magnetic resonance (NMR) or magnetic resonance imaging (MRI) requires the production of a very strong static primary magnetic field for passage through a patient's body. A gradient magnetic field varying with time is superimposed on the primary field. Additionally, the patient is exposed to RF electromagnetic waves that are varied in time and in particular patterns. Under the influence of the magnetic and RF waves, nuclear spin distributions of atomic nuclei can be observed. This technique permits soft tissue and organs of the body to be examined for abnormalities such as tumors.

In MRI, the magnetic field must typically be a strong field on the order of about one kilogauss or more. Fields in excess of ten kilogauss (one Tesla) are sometimes required. Additionally, the field must be uniform, with non-uniformities of no more than one hundred (100) ppm. In addition, this uniformity must encompass a large portion of the patient's body, preferably with a diametral spherical volume (DSV) on the order of about 0.3 to 0.5 meters.

In the past these strong magnetic fields have been generated using permanent magnets, resistive magnets or superconducting magnets. Permanent magnets are typically the least expensive, require minimal site preparation, and are low cost to maintain due to no need for liquid cryogens. Permanent magnets however, have limited field strength, temporal instabilities, are very heavy, and costly at field strengths above 0.20 Tesla. Resistive magnets are also relatively inexpensive but require an elaborate and costly power and water supply. In addition the strength of resistive magnets is limited, large unwanted fringe fields are often generated, and temporal instabilities exist. Superconducting solenoidal magnets have the advantage of a strong field with high uniformity and good temporal stability. Currently known superconducting solenoidal magnets, however, are expensive to construct and maintain and require elaborate liquid cryogenic support systems. In the construction of medical MRI magnets, two different configurations or embodiments are generally in use. One type of supporting structure is known in the art as an open access structure. Such a structure typically includes opposite parallel magnetic pole faces mounted on opposite parallel support plates. At least one and usually four support columns support the support plates and provide a return path for magnetic flux. Such an open structure is favored by patients because it is open and accessible from four sides. With such a structure, the magnetic flux lines pass generally orthogonally to the longitudinal (i.e head to toe) axis of the patient.

Another type of MRI magnet, rather than being constructed with opposite magnetic pole faces or an open access structure, is similar to a large conventional solenoid. The solenoid structure is generally cylindrical in shape and is helically wound with electrically conducting wire. An electric current conducted through the wire produces lines of flux that run through a central opening of the cylinder and generally parallel to the longitudinal axis of the patient. Such an enclosed solenoid structure is known to give some patients a claustrophobic reaction.

Different types of magnet systems have been proposed for use with each of these structures. In the past, open access structures have typically been constructed with permanent magnets attached to the opposite pole faces. U.S. Pat. No. 4,943,774 to Breneman et al. for instance, discloses such an open access MRI structure that utilizes permanent magnets. The supporting structure is fabricated of a ferromagnetic material such as high quality structural steel.

The enclosed solenoid type structures may be formed with superconducting magnets. Such superconducting magnets must be cooled to a temperature close to absolute zero ($-273°$ C.) in order for the wiring to lose resistance to the flow of electric current. Relatively small diameter wires can thus carry large currents and create high magnetic fields. The superconducting wires are typically wrapped around the outer periphery of the cylindrical structure enclosed in a cryostat vessel. Such an enclosed solenoid type structure may employ a pair of main superconducting coils and one or more auxiliary coils. Iron or other ferromagnetic materials can be mounted in the patient receiving opening, as shims for adjusting the shape of the magnetic field. These measures are required to create a uniform field having lines of flux substantially parallel to one another and extending through the patient's body.

Another type of enclosed structure is disclosed in U.S. Pat. No. 4,766,378 to Danby et al. In one embodiment of the Danby et al patent, parallel opposite pole faces are mounted on opposite parallel circular support plates. A substantially continuous support frame is located between the support plates to provide support for the pole faces and a return path for flux. An enclosed patient receiving space is located between the pole faces formed by openings through the support frame. For generating a magnetic field, superconducting wires are wound around each pole face and enclosed within a cryostatic vessel. The continuous support frame is generally circular in shape and shapes the field to create a uniform magnetic field within the enclosed patient space. This arrangement is similar to an open access MRI magnet in that the lines of flux pass generally orthogonally to the patient's body. A problem with this type of structure however, is that a patient may feel even more confined than with a solenoid type structure. Additionally the structure is large and relatively heavy and may be difficult to locate in a conventional hospital without extensive site modifications. A further disadvantage is that there is no access for additional medical personnel to perform interventional radiology.

The present invention is directed to an open access MRI magnet that uses superconducting magnets to generate a uniform magnitude flux field without the use of a heavy and confining support frame, and without the necessity for supplying a liquid cryogen to the system. In addition, the open access frame can be used to provide access for interventional radiology. Accordingly it is an object of the present invention to provide an open access MRI magnet having a uniform magnetic flux field generated by superconducting magnets which are cooled without the use of liquid cryogenics. It is another object of the invention to provide an open access MRI magnet in which a strong magnetic flux field on the order of 0.20–0.5 Tesla can be generated and shaped in a structure that is open for interventional radiology and is not confining to a patient. It is a further object of the present invention to provide an MRI magnet that is simple and inexpensive to build and to operate.

SUMMARY OF THE INVENTION

In accordance with the present invention, an open access superconducting MRI magnet is provided. The MRI magnet includes one or more superconducting coil assemblies for generating a magnetic flux field, a pair of opposed spaced end plates for supporting the superconducting coil assemblies and providing a return path for the flow of magnetic flux, and support posts connecting the end plates. A patient receiving area is formed between the end plates and the superconducting coil assemblies and generates a magnetic flux field parallel to a polar axis generally orthogonally to the end plates and to the patient. The end plates along with rose shims attached to the end plates shape and provide homogeneity for the magnetic flux lines in the patient receiving area. In this respect the end plates provide the same function as pole faces used with prior art permanent magnets.

In a preferred embodiment, a superconducting coil assembly is associated with each end plate. A superconducting coil assembly includes a toroidal vacuum tight vessel, insulation, and one or more temperature shields mounted within the vacuum vessel. A coil of superconducting wire is mounted within the thermal shields and is coupled to a control means including a power source and a persistent switch for generating a continuous current path through the superconducting wire. The coils of superconducting wire, the thermal shields, and the persistent switch are cooled by contact with thermal conductors, or by a combination of conduction and convection through contact with helium gas tubing. The cooling source is a two stage Gifford-McMahon type cryocooler. The cryocooler cools the gas just before circulation around the superconducting windings.

The end plates and supporting columns provide a return path for magnetic flux generated by the superconducting coil assemblies. The magnetic flux field may be shaped to provide a diametral spherical volume (DSV) within the patient receiving area having a substantially uniform and strong magnetic field in the range of 0.20–0.5 Tesla. Additionally, access to the patient receiving area is substantially open, and the patient is accessible to multiple medical personnel and additional equipment. This open access frame is less restrictive to a patient and allows easier access for the practice of medical procedures such as interventional radiology.

Other objects, advantages and capabilities of the present invention will become more apparent as the description proceeds.

DESCRIPTION OF PREFERRED EMBODIMENTS

Figure 1:
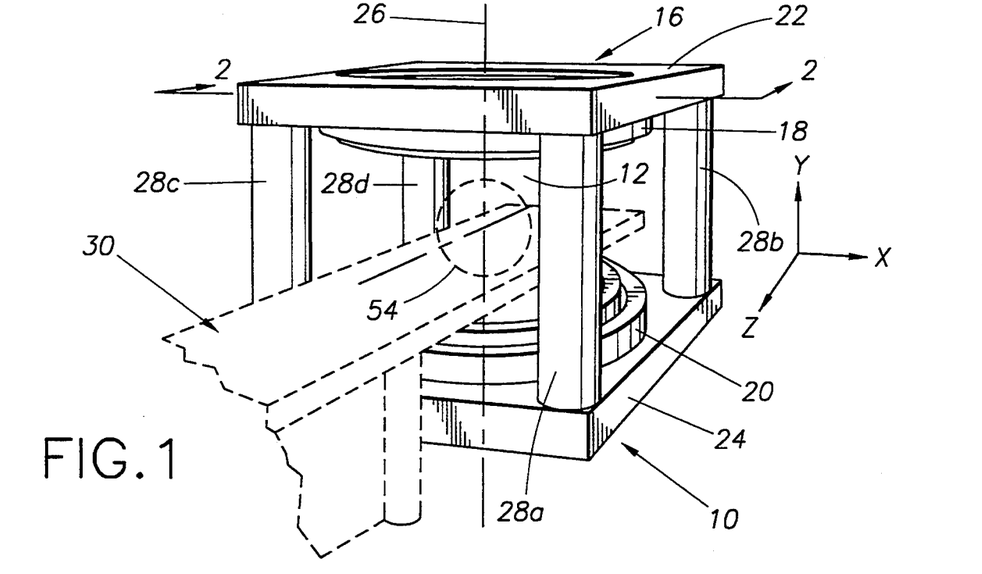
FIG. 1 is a perspective view of the main structural elements of a four post open access superconducting MRI magnet constructed in accordance with the invention and shown with a patient support means in phantom.
Figure 2:
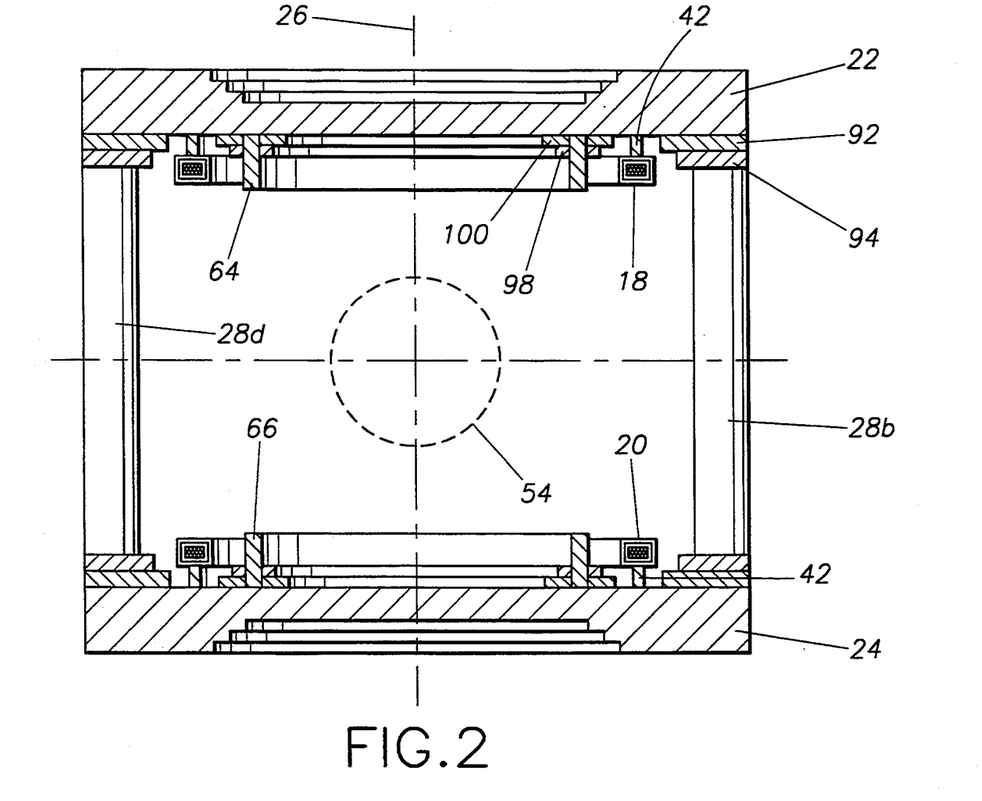
FIG. 2 is a partial schematic view taken along section line 2—2 of FIG. 1.

Referring now to FIGS. 1 and 2, an open access superconducting MRI magnet apparatus constructed in accordance with the invention is shown and generally designated as 10. The superconducting magnet apparatus 10 includes an open access frame 16 for supporting an upper superconducting coil assembly 18 and a lower superconducting coil assembly 20.

The open access frame 16 is formed of a ferromagnetic material that can be readily magnetized (i.e. magnetically soft). A preferred material for the frame 16 is low carbon steel. The open access frame 16 includes an upper end plate 22 and a lower end plate 24 for supporting the upper superconducting coil assembly 18 and lower superconducting coil assembly 20 respectively. The upper end plate 22 and lower end plate 24 may each have a generally rectangular or square outer peripheral configuration. The upper end plate 22 and lower end plate 24 are parallel to one another and generally orthogonal to a vertical polar axis 26, that passes through the middle of the open access frame 16.

The open access frame 16 also includes four support columns 28a, 28b, 28c, 28d fixedly attached to the upper end plate 22 and lower end plate 24. Alternatively the open access frame 16 may be formed with a lesser number of support columns (one to three). A patient receiving area 12 is defined by the upper end plate 22 and lower end plate 24 and by the four support columns 28a, 28b, 28c, 28d. The support columns 28a, 28b, 28c, 28d are generally cylindrical in shape and are positioned in a generally square pattern parallel to one another. The support columns 28a, 28b, 28c, 28d are spaced far enough apart, from one another, to permit patient access from each of the four sides of the support frame 16. As an example, and as shown in phantom in FIG. 1, a patient support means 30 may be placed between any two support columns for supporting a patient in a reclining position between the superconducting coil assemblies 18, 20. The arrangement also permits access from different sides of the patient support means 30 for interventional radiology.

The support columns 28a, 28b, 28c, 28d, in addition to supporting the end plates 22, 24, also provide a return path for magnetic flux generated by the superconducting coil assemblies 18, 20. As shown in FIG. 2, the end plates 22, 24 may be formed with a stepped construction in order to efficiently channel a return flow of magnetic flux without substantial flux loss. Additionally, as shown in FIG. 2, the support columns 28a, 28b, 28c, 28d, may be connected to the upper end plate 22 or lower end plate 24 using transition plates 92, 94 similar to those disclosed in U.S. Pat. No. 4,943,774 to Breneman et al.

Figure 3:
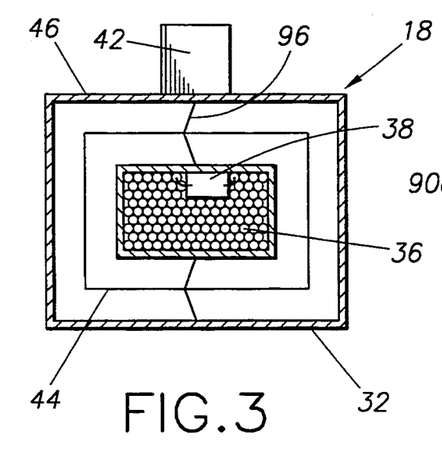
FIG. 3 is an enlarged portion of FIG. 2 showing a schematic cross section through a superconducting coil in detail.

With reference to FIG. 3, each superconducting coil assembly 18, 20 includes a toroidal, vacuum-tight vessel 32 formed from a non-magnetic material, and one or more coils of superconducting wire 36 mounted within the vacuum vessel 32. In addition, a persistent switch 38 is electrically coupled to the superconducting wire 36. With such a superconducting coil assembly 18, 20 the coils of superconducting wire 36 can be cooled to a temperature close to absolute zero, and at this temperature essentially have zero resistance to current flow.

The vacuum-tight vessel 32 for each superconducting coil assembly 18, 20 is generally toroidal in shape and mounted to the upper support plate 22 or lower support plate 24, respectively, on mounting blocks 42, or other suitable mounting means. Each vacuum vessel 32 is adapted for one time evacuation by a suitable vacuum source such as a vacuum pump (not shown). A suitable material for the vacuum vessels 32 is aluminum or stainless steel. In addition to being vacuum tight, each vacuum vessel 32, is insulated with a suitable insulating material such as super insulation (aluminized mylar) or the like. One or more metal temperature shields 44 may also be mounted within the vacuum vessel 32 as an additional heat barrier. The vacuum vessel 32 may be formed with a sealed top plate 46 that provides access to the coil leads and instrumentation located within vacuum vessel 32.

The temperature shield 44 may be mounted on support straps 96. Such support straps are shown schematically in FIG. 3 and may be similar in construction to those disclosed in U.S. Pat. No. 4,622,824 to R. L. Creedon, which is incorporated herein by reference.

Each continuous coil of superconducting wire 36 is helically wound within the toroidal vacuum vessel 32. A coil of superconducting wire 36 may be formed of any material such as a low temperature or high temperature superconductor that becomes superconducting below a superconducting transition temperature. For low temperature superconductors this is at a temperature of approximately 8K. For high temperature superconductors, the superconducting transition temperature may be approximately 60K. As an example, one suitable low temperature superconductor is copper having niobium titanium filaments within the wire. One suitable high temperature superconductor is YBCO. Alternatively, any material suitable for superconducting can be utilized in this application, as long as the correct operating temperature is provided to the coil.

Figure 6:
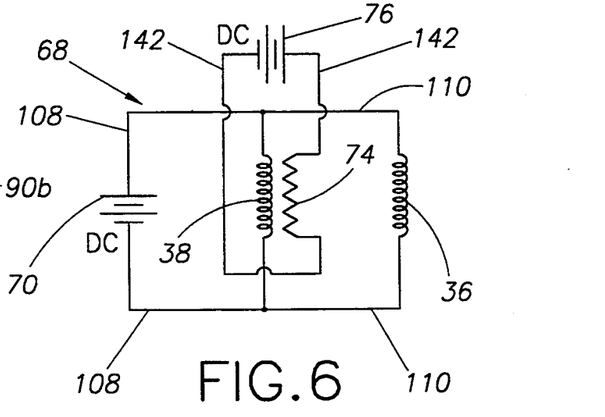
FIG. 6 is an electrical schematic of a superconducting coil and persistent switch of an MRI magnet constructed in accordance with the invention.
Figure 8:
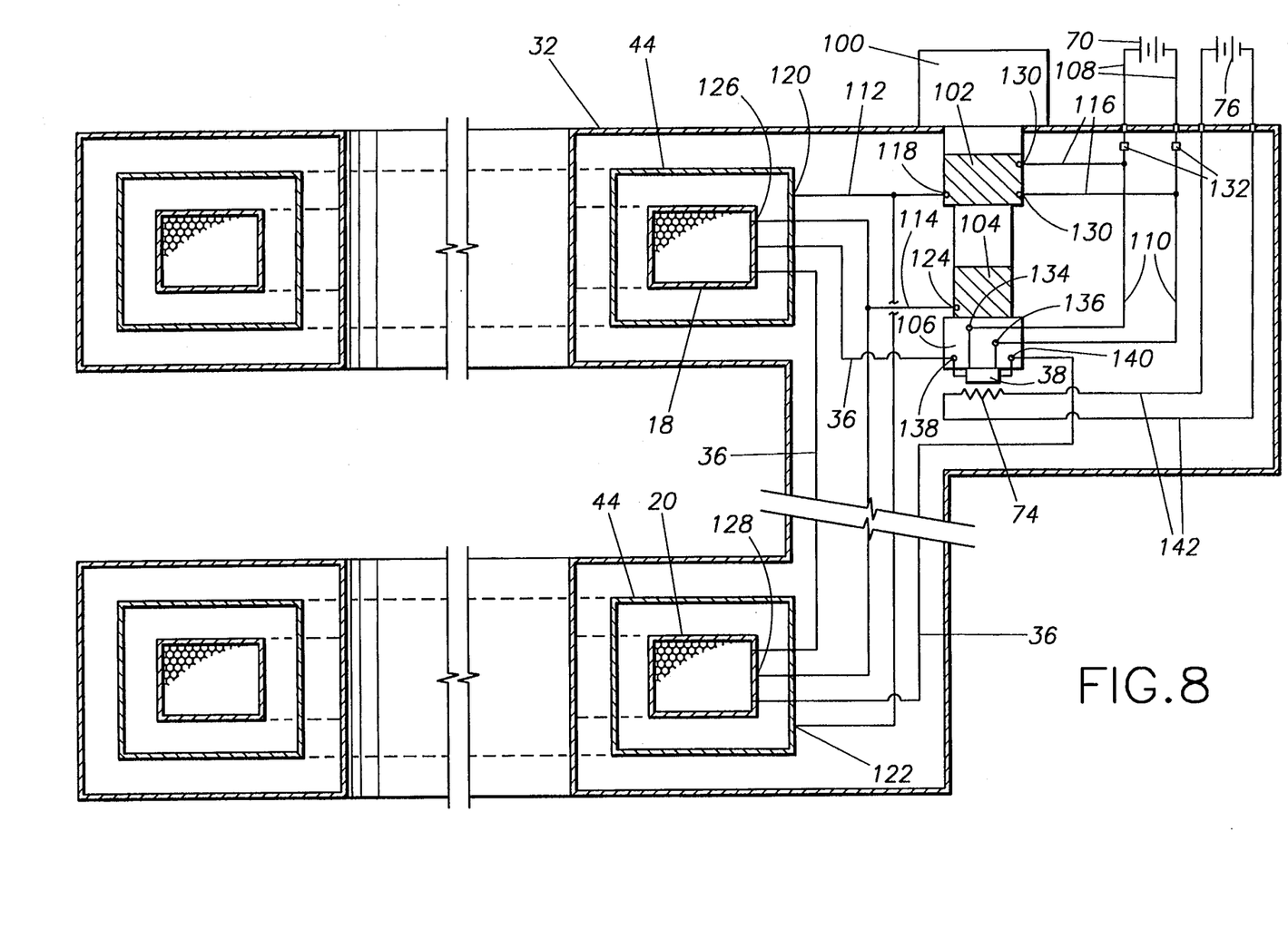
FIG. 8 is a schematic view of the conductive cooling apparatus of one embodiment of the present invention.

The coil of superconducting wire 36 is formed with a longitudinal axis coincident with the vertical polar axis 26. Additionally, each coil of superconducting wire 36 lies in a plane generally parallel to the plane of the upper end plate 22 and the plane of the lower end plate 24. The superconducting coil assemblies 18, 20 also are electrically connected to a persistent switch 38. With reference to FIGS. 6 and 8, the superconducting wire 36 is electrically coupled to a source of DC power 70, by means of external power leads 108 and superconducting power leads 110. External leads 108 are made of a typical copper conductor, while superconducting leads 110 can be made of a superconducting material having a high transition temperature. External leads 108 and superconducting leads 110 can be joined at junctions 132. In order to maintain a continuous flow of current in the coils of superconducting wire 36 for the upper and lower superconducting coil assemblies 18, 20, without continuous power consumption from DC power supply 70, a physically smaller non-inductive superconducting coil constituting the persistent switch 38 is wired to the main coils of superconducting wire 36 and to the superconducting leads 110 at junctions 134, 136, 138, and 140. The persistent switch 38 is thermally in contact with a heating element 74 which has its own DC power supply 76 via leads 142. When the heating element 74 is energized, it will raise the persistent switch 38 above its transition temperature, causing it to function as an open switch. When the heating element 74 is deenergized, the persistent switch 38 can drop below its transition temperature, causing it to function as a closed switch. As is apparent to one skilled in the art, once a current flow is generated through the main coils of superconducting wire 36, the persistent switch 38 can be closed to maintain a continuous current flow with the consumption of no electrical power.

Referring again to FIG. 2, energizing the coil of superconducting wire 36 on the upper and lower superconducting coil assemblies 18, 20 generates a magnetic flux field that emanates generally orthogonally from the plane of the upper and lower end plates 22, 24. A return path for the magnetic flux is provided by upper and lower end plates 22, 24 and by the support columns 28a, 28b, 28c, 28d. The magnetic flux field produced by the superconducting wires 36 is shaped to provide a substantially uniform field in a diametral spherical volume (DSV) 54. The DSV 54 is centered along the vertical polar axis 26 midway between the upper and lower superconducting coil assemblies 18, 20, and is preferably 0.3 to 0.5 meters in diameter.

For generating a magnetic flux field having lines of flux that extend through the DSV generally parallel to the vertical polar axis 26, and parallel to one another, the magnetic flux lines must be shaped. Accordingly, a magnetic flux shaping means includes an upper rose shim 64 and a lower rose shim 66 which are fixedly attached to the upper end plate 22 and lower end plate 24, respectively. The rose shims 64, 66 are generally fabricated of a ferromagnetic material. The rose shims 64, 66 may be, but are not limited to, a flat and cylindrical shape. The rose shims 64, 66 are therefore formed like a washer with an inner diameter and an outer diameter. The inner diameter of the rose shims 64, 66 may be sized as required to provide a magnetic flux field having desired characteristics. Additionally, as shown in FIG. 2, the rose shims 64, 66 may be formed with stacked transitions plates 98, 100 for further shaping the magnetic flux field.

Figure 7:
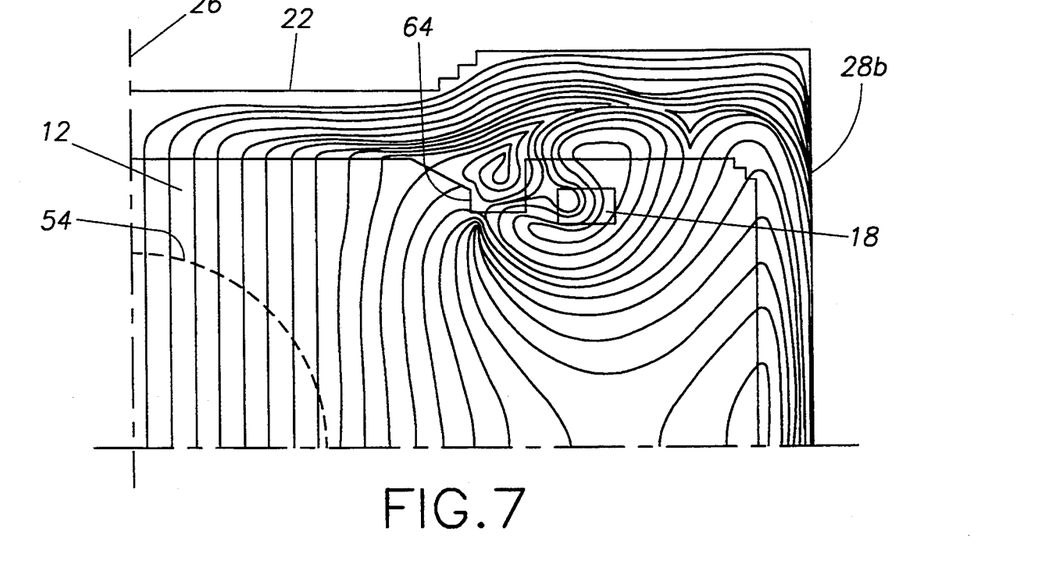
FIG. 7 is a schematic view showing distribution of a magnetic flux field and a return path for the magnetic flux field.

A schematic of a representative magnetic flux field generated by an MRI superconducting magnet is shown in FIG. 7. Such a magnetic flux field is characterized by parallel lines of magnetic flux in the DSV 54 located within the patient receiving area 12. Additionally, the function of the rose shims 64, 66 in shaping the magnetic flux lines is illustrated in FIG. 7. Moreover, the function of a typical support column 28b and the function of the upper end plate 22, in channeling a return flow of flux, are illustrated in FIG. 7.

Figure 4:
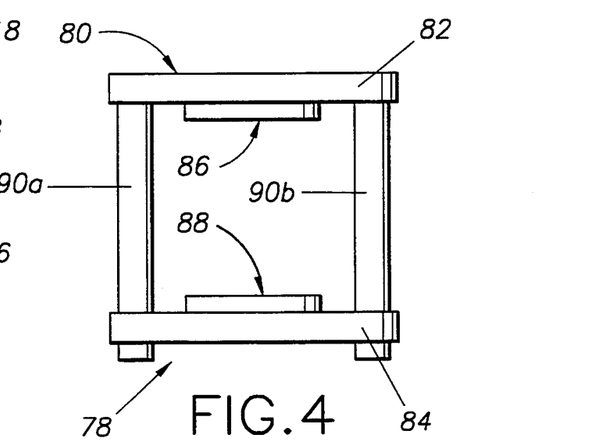
FIG. 4 is a two post open access superconducting MRI magnet constructed in accordance with the invention.
Figure 5:
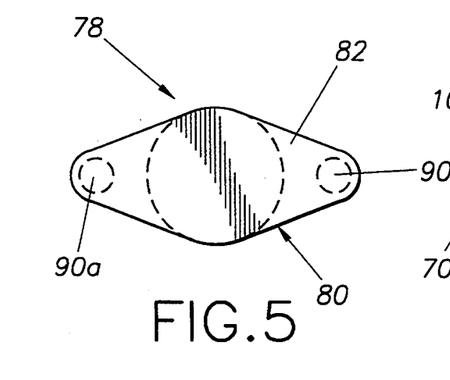
FIG. 5 is a plan view of FIG. 4.

An alternate embodiment MRI magnet with a two post open access frame is shown in FIGS. 4 and 5, and is designated as 78. The two post MRI magnet 78 is substantially similar in construction to the four post open access MRI magnet apparatus 10 previously described but with the exception of the construction of the support frame 80. Support frame 80 includes an upper end plate 82 for upper superconducting coil assembly 86 and a lower end plate 84 for lower superconducting coil assembly 88. Patient access into the two post MRI magnet 78 is from two sides.

FIG. 8 shows a preferred embodiment of the apparatus used to cool the various components of the apparatus 10, according to the present invention. The present invention involves lowering the components to the necessary temperatures by means of a cryocooler 100, without the consumption of liquid cryogens. The cryocooler 100 is preferably a multi-stage cryocooler having stages capable of achieving progressively colder temperatures, such as a Gifford-McMahon type two stage cryocooler capable of achieving a temperature at its first or primary stage 102 of approximately 40K, and a temperature at its second or secondary stage 104 of approximately 4K. The cooling capacity of the cryocooler 100 at these temperatures is approximately 30 watts at the primary stage, and 0.5 watt at the secondary stage. The cryocooler 100 has its cooling stations within the vacuum vessel 32. As shown, the vacuum vessel is in the form of an upper toroidal section and a lower toroidal section, joined by a passageway section. FIG. 8 shows the entire vacuum vessel schematically, while FIG. 9 only shows one side of the upper and lower sections, for simplicity.

In the embodiment of FIG. 8, the components of the apparatus 10 are cooled entirely by conduction, by thermally conductive contact with a plurality of solid thermal conductors which are connected to the cryocooler 100. These solid thermal conductors can take the form of cables, bars, or other solid forms. Specifically, a copper bar or plate 106 is fastened in thermally conductive contact with the second stage 104 of the cryocooler 100. Thermally conductive cables 112, shown as a split cable, are fastened in thermally conductive contact at point 118 to the first stage 102 of the cryocooler 100. Thermally conductive cables 114, again shown as a split cable, are fastened in thermally conductive contact at point 124 to the second stage 104 of the cryocooler 100. Finally, thermally conductive cables 116 are fastened in thermally conductive contact at points 130 to the first stage 102 of the cryocooler 100.

The persistent switch 38 is mounted to the copper plate 106. Junctions 134, 136, 138, 140 are also mounted directly to the copper plate 106, to insure that the junctions are maintained at the lowest possible temperature to minimize the current decay resulting from resistance at these junctions. Thermally conductive cables 112 are mounted in thermally conductive contact at points 120 and 122 to the thermal shields 44 surrounding the upper and lower superconducting coils 18, 20, to maintain the upper and lower thermal shields 44 at approximately 40K. Cables 112 can alternatively be wrapped around portions of the thermal shields 44. Thermally conductive cables 114 are mounted in thermally conductive contact around the peripheries of the upper and lower superconducting coils 18, 20, shown schematically as points 126 and 128, to maintain the upper and lower superconducting coils 18, 20 at or near 4K. Ideally, the cables 114 will pass twice around each superconducting coil 18, 20. Finally, thermally conductive cables 116 are fastened in thermally conductive contact to the superconducting power leads 110, to maintain the leads below 50K.

Figure 9:
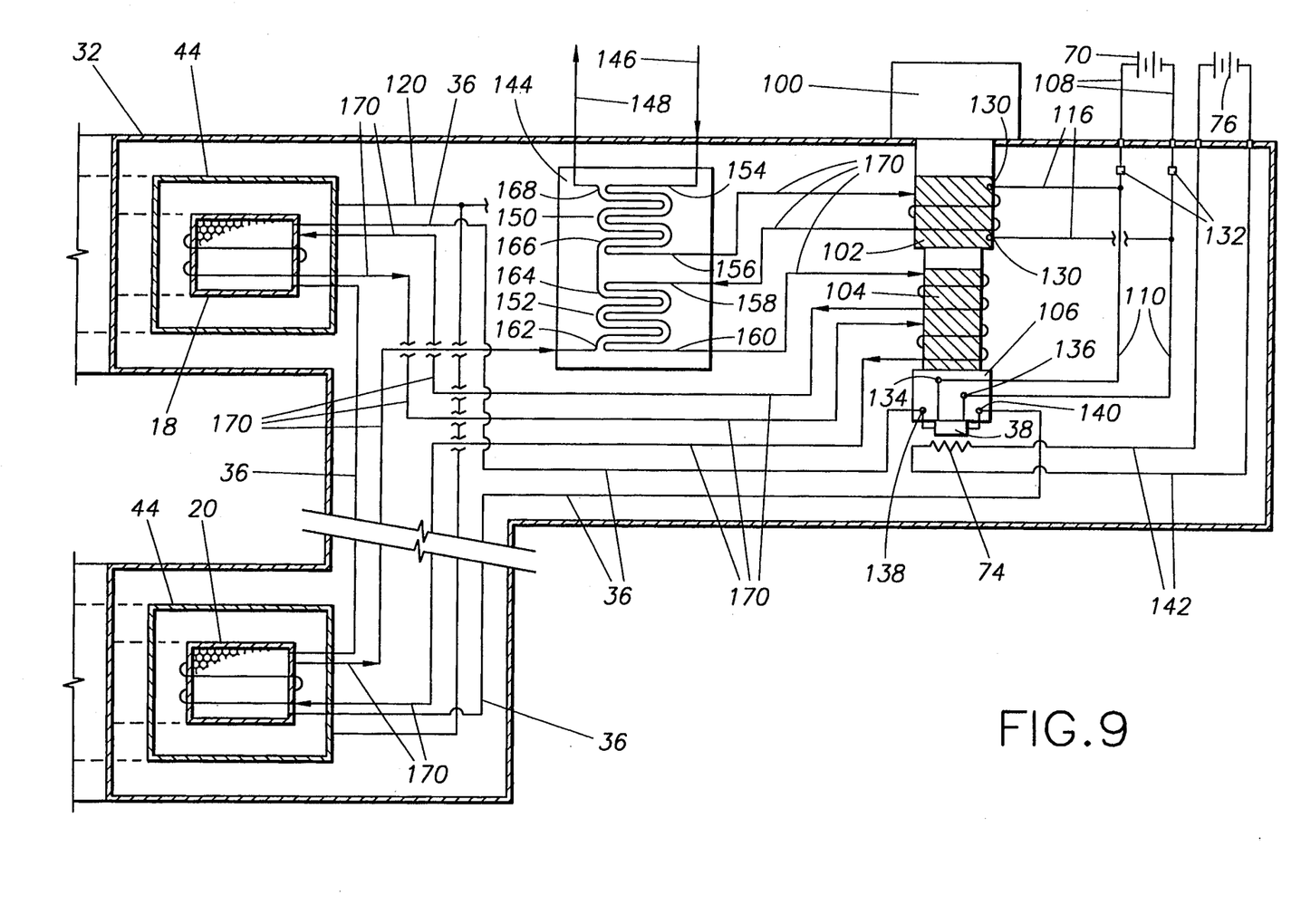
FIG. 9 is a schematic view of the conductive cooling apparatus of a second embodiment of the present invention.

FIG. 9 shows a second embodiment of the present invention, wherein the cooling of the upper and lower superconducting coils 18, 20 is accomplished by a combination of conduction and convection, through the use of a cooling circuit consisting of tubing 170 through which a fluid, such as helium gas, is pumped. The cooling fluid is passed through a counterflow heat exchanger 144, and around the primary stage 102 and the secondary stage 104 of the cryocooler 100, to lower the temperature of the fluid to approximately 4K, which is below the transition temperature of the upper and lower superconducting coils 18, 20. The heat exchanger 144 is located within the vacuum vessel 32. Specifically, the cooling fluid, in the form of a gas, is pumped by a compressor (not shown) into the inlet 146 of the heat exchanger 144, at a nominal temperature of approximately 300K at point 154, and a nominal pressure of approximately 20 atmospheres.

The inflow fluid then passes through the first section 150, where the inflow tubing is in thermally conductive contact with the outflow tubing, lowering the temperature of the inflow fluid to approximately 45K at point 156. The first section of the heat exchanger 144 can be made of stainless steel. The inflow fluid is then circulated out of the heat exchanger 144 to pass around the primary stage 102 of the cryocooler 100, lowering the temperature of the fluid to approximately 40K at point 158, where the fluid is returned to the second section 152 of the heat exchanger 144. The second section 152 of the heat exchanger 144 can be copper or stainless steel tubing, again placing the inflow tubing in thermally conductive contact with the outflow tubing, lowering the temperature of the inflow fluid to approximately 4.5K at point 160.

The cooling fluid is then carried by the tubing 170 to pass around the secondary stage 104 of the cryocooler 144, lowering the temperature to approximately 4K, and then around the upper superconducting coil 18. The tubing 170 is shown schematically wrapped around the coil 18. Since the tubing is in thermally conductive contact with the coil 18, this raises the temperature of the fluid to approximately 4.5K. The tubing 170 then returns to pass around the secondary stage 104 again, lowering the temperature to approximately 4K, after which the tubing 170 passes around the lower superconducting coil 20 and returns to the heat exchanger 144 at point 162.

At the return point 162, the outflow fluid is at approximately 4.5K before it passes through the second section 152 of the heat exchanger 144, exiting the second section 152 at approximately 40K at point 164. Finally, the outflow fluid enters the first section 150 of the heat exchanger 144 at approximately 45K at point 166, and exits the first section 150 at a nominal temperature of approximately 300K at point 168. From outlet 148, the fluid is returned, through a needle valve, to the compressor in a gaseous form at a nominal pressure of approximately 2 atmospheres. Cooling of the other cooled components of the apparatus is accomplished by conduction alone, through the use of solid thermal conductors, as described above.

OPERATION

For operation of the MRI superconducting magnet apparatus 10, the upper and lower superconducting coil assemblies 18, 20 are cooled and maintained at a temperature about 4K. A flow of current is then generated through the coils of superconducting wires 36 by energization of the DC power supply 70. Once a current flow is initiated and stabilized, the persistent switch assembly 38 is closed to maintain a continuous flow of current through the coils of superconducting wires 36, as previously described, without power consumption. With current flowing through the superconducting wires 36, a magnetic flux field is induced. The magnetic flux field is shaped by the rose shims 64, 66 such that the lines of magnetic flux are substantially parallel to one another in the DSV 54. For a typical value of about 218,000 ampere turns in the coils of superconducting wires 36, a magnetic flux field in the range of about 0.35 Tesla is produced. With such an MRI superconducting magnet apparatus 10 as disclosed, a magnetic flux field in the range of 0.20–0.50 Tesla is preferable.

A return path for the magnetic flux field generated by the flow of current in the coils of superconducting wire 36 is provided by the open access frame 16. The return path includes magnetic flux flow through the support columns 28a, 28b, 28c, 28d and through the upper and lower end plates 22, 24 of the open access frame 16.

In operation, the patient receiving area 12 is accessible from four sides. This allows access to the patient for additional medical equipment and personnel. Medical techniques requiring such access, such as interventional radiology, can therefore be practiced more easily than prior art MRI magnets that are substantially enclosed.

Thus, the invention provides an open access MRI magnet utilizing opposite parallel end plates and superconducting coils for generating a strong and uniform flux field. Because the MRI magnet can be easily accessed by a patient and is open on at least two sides, a patient is less likely to experience claustrophobia during use, and interventional radiology can be practiced. Moreover, a control circuit for the superconducting wire includes a persistent switch for reduced power consumption. Cooling of the components of the apparatus 10 is accomplished without the consumption of liquid cryogens. In addition, because of the open access structure, and a relatively low fringe field, fewer site modifications should be required during installation.

Although only certain embodiments of the invention have been described herein, it will be apparent to one skilled in the art that changes and modifications may be made thereto without departing from the spirit and scope of the invention as claimed.

I claim:

1. An open access magnetic resonance imaging apparatus, comprising:

a substantially open ferromagnetic frame including an upper end plate and a lower end plate mounted horizontally, spaced apart, and generally parallel to one another on at least one support column, to define a patient receiving area therebetween accessible to additional medical equipment and personnel;

first and second toroidal shaped coils of superconducting wire mounted to said upper and lower end plates, respectively, for generating a magnetic flux field along a vertical polar axis, with a return path for said magnetic flux field provided by said support column and by said upper and lower end plates, said superconducting wire having a low transition temperature;

magnetic flux shaping means mounted to each said end plate for shaping said flux field to provide generally parallel lines of magnetic flux within said patient receiving area, said flux shaping means including a rose shim mounted to each said end plate;

a cryocooler; and first and second solid thermal conductors attached to said cryocooler, said first and second solid thermal conductors being mounted in thermally conductive contact with said first and second superconducting coils, respectively, for cooling said superconducting coils by conductive heat transfer, to maintain said superconducting coils at a temperature below said low transition temperature of said superconducting wire.

2. The open access magnetic resonance imaging apparatus as defined in claim 1, wherein:

said cryocooler has two stages, with a secondary stage being colder than said low transition temperature and colder than a primary stage, said first and second thermal conductors being attached to said secondary stage, and further comprising:

first and second vacuum vessels surrounding said first and second superconducting coils, respectively;

a third vacuum vessel providing a passageway between said first and second vacuum vessels;

first and second temperature shields mounted around said first and second superconducting coils, respectively, within said first and second vacuum vessels; and third and fourth solid thermal conductors mounted in thermally conductive contact with said first and second temperature shields, respectively, and attached to said primary stage of said cryocooler for cooling said temperature shields by conductive heat transfer, said third and fourth thermal conductors being contained within said vacuum vessels.

3. The open access magnetic resonance imaging apparatus as defined in claim 2, further comprising:

external power leads electrically connected to said superconducting coils for passing electrical current through said superconducting coils to create said magnetic flux field;

a persistent switch electrically coupled with said superconducting coils, by a plurality of junctions, for selectively isolating said superconducting coils from said external power leads, while maintaining current flow through said superconducting coils, said persistent switch being contained within one of said vacuum vessels; and a fifth solid thermal conductor attached to said secondary stage of said cryocooler;

wherein said plurality of electrical junctions are mounted on said fifth solid thermal conductor for cooling said plurality of electrical junctions below said low transition temperature, by conductive heat transfer.

4. The open access magnetic resonance imaging apparatus as defined in claim 3, further comprising:

superconducting power leads electrically connected between said external power leads and said superconducting coils, said superconducting power leads being made of wire having a high transition temperature above the temperature of said primary stage of said cryocooler; and sixth and seventh solid thermal conductors mounted in thermally conductive contact with said superconducting power leads and attached to said primary stage of said cryocooler for cooling said superconducting power leads below said high transition temperature by conductive heat transfer, said sixth and seventh thermal conductors being contained within one of said vacuum vessels.

5. The open access magnetic resonance imaging apparatus as defined in claim 4, wherein:
said primary stage of said cryocooler is maintained at a temperature of approximately 40K; and
said secondary stage of said cryocooler is maintained at a temperature of approximately 4K.

6. An open access magnetic resonance imaging apparatus, comprising:
a substantially open ferromagnetic frame including an upper end plate and a lower end plate mounted horizontally, spaced apart, and generally parallel to one another on at least one support column, to define a patient receiving area therebetween accessible to additional medical equipment and personnel;
first and second toroidal shaped coils of superconducting wire mounted to said upper and lower end plates, respectively, for generating a magnetic flux field along a vertical polar axis, with a return path for said magnetic flux field provided by said support column and by said upper and lower end plates, said superconducting wire having a low transition temperature;
magnetic flux shaping means mounted to each said end plate for shaping said flux field to provide generally parallel lines of magnetic flux within said patient receiving area, said flux shaping means including a rose shim mounted to each said end plate;
a cryocooler; and
a tubular cooling circuit mounted in thermally conductive contact with said cryocooler and said superconducting coils for circulating a cooling fluid around said superconducting coils to cool said superconducting coils by a combination of convective and conductive heat transfer, to maintain said superconducting coils at a temperature below said low transition temperature; and
a counterflow heat exchanger in fluid communication with said cooling circuit for precooling said cooling fluid upstream of said cryocooler, said heat exchanger being contained within one of said vacuum vessels.

7. The open access magnetic resonance imaging apparatus as defined in claim 6, wherein:
said cryocooler has two stages, with a secondary stage being colder than said low transition temperature and colder than a primary stage;
said heat exchanger has two sections, with a first section designed to lower inflowing cooling fluid to near said temperature of said primary stage of said cryocooler, and a second section designed to lower said cooling fluid from said temperature of said primary stage to near said temperature of said secondary stage of said cryocooler;
said cooling circuit is routed to circulate said inflowing cooling fluid around said primary stage of said cryocooler between said first and second sections of said heat exchanger, and to circuit said inflowing cooling fluid around said secondary stage of said cryocooler downstream of said heat exchanger, and further comprising:
first and second vacuum vessels surrounding said first and second superconducting coils, respectively;
a third vacuum vessel providing a passageway between said first and second vacuum vessels;
first and second temperature shields mounted around said first and second superconducting coils, respectively, within said first and second vacuum vessels; and
first and second solid thermal conductors mounted in thermally conductive contact with said first and second temperature shields, respectively, and attached to said primary stage of said cryocooler for cooling said temperature shields by conductive heat transfer, said first and second thermal conductors being contained within said vacuum vessels.

8. The open access magnetic resonance imaging apparatus as defined in claim 7, further comprising:
external power leads electrically connected to said superconducting coils for passing electrical current through said superconducting coils to create said magnetic flux field;
a persistent switch electrically coupled with said superconducting coils, by a plurality of junctions, for selectively isolating said superconducting coils from said external power leads, while maintaining current flow through said superconducting coils, said persistent switch being contained within one of said vacuum vessels; and
a third solid thermal conductor attached to said secondary stage of said cryocooler;
wherein said plurality of electrical junctions are mounted on said third solid thermal conductor for cooling said plurality of electrical junctions below said low transition temperature, by conductive heat transfer.

9. The open access magnetic resonance imaging apparatus as defined in claim 8, further comprising:
superconducting power leads electrically connected between said external power leads and said superconducting coils, said superconducting power leads being made of wire having a high transition temperature above the temperature of said primary stage of said cryocooler; and
fourth and fifth solid thermal conductors mounted in thermally conductive contact with said superconducting power leads and attached to said primary stage of said cryocooler for cooling said superconducting power leads below said high transition temperature by conductive heat transfer, said fourth and fifth thermal conductors being contained within one of said vacuum vessels.

10. The open access magnetic resonance imaging apparatus as defined in claim 9, wherein:
said primary stage of said cryocooler is maintained at a temperature of approximately 40K; and
said secondary stage of said cryocooler is maintained at a temperature of approximately 4K.

* * * * *